United States Patent [19]

Aratani et al.

[11] Patent Number: 5,510,095
[45] Date of Patent: Apr. 23, 1996

[54] PRODUCTION OF HIGH-PURITY SILICON INGOT

[75] Inventors: Fukuo Aratani, Chiba; Kyojiro Kaneko, Amagasaki, both of Japan

[73] Assignee: Kawasaki Steel Corporation, Kobe, Japan

[21] Appl. No.: 139,633

[22] Filed: Oct. 19, 1993

Related U.S. Application Data

[63] Continuation of Ser. No. 760,695, Sep. 16, 1991, abandoned.

[30] Foreign Application Priority Data

Sep. 20, 1990 [JP] Japan ................................ 2-248883

[51] Int. Cl.⁶ .......................... C30B 15/12; C30B 13/20
[52] U.S. Cl. ................... 423/348; 117/7; 117/8; 117/10
[58] Field of Search ........................ 423/348, 349, 423/350; 156/615, 616.1, 616.2, 616.4, 628.7, 620.72, DIG. 96; 164/122.1, 122.2; 65/144, 18.1, 18.4, 18.2, 335; 117/7, 8, 10

[56] References Cited

U.S. PATENT DOCUMENTS

| 4,399,116 | 8/1983 | Amouroux et al. | 423/348 |
| 4,915,723 | 4/1990 | Kaneko et al. | 65/144 |

FOREIGN PATENT DOCUMENTS

| 7063 | 1/1980 | European Pat. Off. | 423/348 |
| 0045689 | 2/1982 | European Pat. Off. | |
| 0349904 | 1/1990 | European Pat. Off. | |
| 2831817 | 1/1980 | Germany | 423/348 |
| 63-218506 | 9/1988 | Japan . | |
| 2-230698 | 2/1990 | Japan . | |
| 922879 | 4/1963 | United Kingdom | 423/348 |
| 1103329 | 2/1968 | United Kingdom | 423/348 |

OTHER PUBLICATIONS

Japanese Abstract 2–30698 Feb. 1990 "Casting Device of Silicon".

Japanese Abstract 1–264920 Oct. 1989 "Silicon Casting Device".

*Primary Examiner*—Ferris Lander
*Assistant Examiner*—Stuart L. Hendrickson
*Attorney, Agent, or Firm*—Dvorak and Traub

[57] ABSTRACT

A process for producing high-purity silicon for solar cells continuously directly from inexpensive silicon containing a comparatively large amount of impurities. This process comprises melting continuously supplied raw material silicon in a bottomless crucible placed in an induction coil, while blowing a hot plasma gas incorporated with an oxygen-containing substance on the surface of the melt for purification, and continuously discharging the solidified silicon downward from said bottomless crucible, with at least an axial part of said bottomless crucible being divided into a plurality of electrically conductive pieces spaced circumferentially.

2 Claims, 2 Drawing Sheets

PRODUCTION OF HIGH-PURITY SILICON INGOT

This application is a continuation of application Ser. No. 07/760,695, filed 16 September 1991, now abandoned.

BACKGROUND OF THE INVENTION

1. Field of the Invention

The present invention relates to a process for producing a high-purity polycrystalline silicon ingot to be made into solar cells. More particularly, the present invention is concerned with a process for producing high-purity silicon for solar cells continuously directly from inexpensive silicon containing a comparatively large amount of impurities by remelting it.

2. Description of the Prior Art

The silicon substrate for solar cells should be of high purity so that it possesses the characteristic properties of semiconductor required of solar cells. The level of purity should be such that the total amount of impurities such as B, P, Al, Fe, and Ti should not exceed 1 ppm. Moreover, the silicon substrate should have grain boundaries aligned and defects (such as dislocation) reduced to a minimum. These requirements have conventionally been met by making an ingot by casting from expensive silicon of semiconductor grade and slicing it into substrates. This method suffers from several disadvantages, including high material cost, entrance of impurities from the casting mold, and poor productivity. (Casting needs a large amount of manpower and materials.)

To eliminate these disadvantages, there has recently been proposed a purification process by high-frequency plasma for the production of high-purity silicon (as disclosed in Japanese Patent Laid-open No. 218506/1988). This process, however, still has a disadvantage of low yields and necessity for complex post-treatment, because melting for purification is accomplished partly, with the remainder in contact with the container, to avoid the entrance of impurities from the container.

Also, there has recently been proposed an improved casting method which utilizes electromagnetic power for melting (as disclosed in Japanese Patent Application No. 167194/1988). This method permits the removal of heavy metals (such as Fe and Ti) by segregation, but it does not effectively remove B and P which have a high segregation coefficient (partition ratio of a substance between the solid and liquid phases). Moreover, this method needs semiconductor grade silicon as a raw material.

SUMMARY OF THE INVENTION

The present invention was completed to address the problems involved in the prior art technology. It is an object of the present invention to provide a process for producing a high-purity silicon ingot for polycrystalline silicon substrates for solar cells economically in high yields from inexpensive metallic silicon containing impurities. The present invention is embodied in a process for producing a high-purity polycrystalline silicon ingot from silicon containing more than 1 ppm each of B, P, Al, Fe, and Ti which are impurities deleterious to solar cells.

The first aspect of the present invention resides in a process for producing a high-purity silicon ingot, said process comprising melting continuously supplied raw material silicon in a bottomless crucible, while blowing a hot plasma gas incorporated with an oxygen-containing substance on the surface of the melt for purification, and continuously discharging the solidified silicon downward from the bottomless crucible, said bottomless crucible being placed in an induction coil, with at least a part thereof in the axial direction being comprised of a plurality of electrically conductive pieces divided in the circumferential direction.

The second aspect of the present invention resides in a process for producing a high-purity silicon ingot, said process comprising a first step for the preliminary purification of silicon which is carried out as defined in the first aspect, and a second step of melting the silicon ingot obtained in the first step in another bottomless crucible, permitting the molten silicon to solidify in one direction, and discharging the solidified silicon continuously.

The third aspect of the present invention comprises a process for producing a high-purity silicon ingot as defined in the second aspect, wherein the bottomless crucibles in the first and second steps are arranged coaxially and the ingot in the second step has a larger sectional area than that in the first step.

FIG. 2 shows the bottomless crucible used in the present invention. The bottomless crucible 20, which is placed in an induction coil 21, is divided into a plurality of electrically conductive pieces 22 spaced circumferentially. A raw material 23 is melted in this bottomless crucible, and the melt is gradually pulled down as it solidifies. Thus the raw material 23 is continuously made into an ingot 24. This continuous casting method offers the advantage of keeping the molten raw material 23 separated from the inside of the bottomless crucible, with a gap 25 interposed between them. This effect is due to the fact that the bottomless crucible 20 is divided into a plurality of pieces spaced circumferentially. Each divided piece 22 creates an electric current 22a (indicated by an arrow) which is induced by the current 21a flowing through the induction coil 21. The electric currents 22a as a whole creates an electric current 23a (indicated by an arrow) in the raw material 23 being melted in the crucible 20. As the raw material melts, the electric currents 23a and 22a create a repulsion force between them, causing the molten raw material to separate from the divided pieces 22 of the crucible 23.

The process of the present invention will be described with reference to the accompanying drawing.

FIG. 1 is a schematic drawing showing the apparatus used to practice the present invention. The apparatus consists of unit A for the first step and unit B for the second step.

If the purpose of the present invention is the mere purification of silicon, it is possible to carry out only the first step independently, in which case unit A alone is used. If the present invention is practiced to produce an ingot for polycrystalline silicon substrates, it is necessary to carry out the first and second steps sequentially.

The first step of the process of the present invention is carried out in the following manner. A steam-containing hot plasma gas is generated by the plasma gas generator 1. The plasma gas is blown on the surface of the molten silicon 6 which is kept at a constant level by the continuous or intermittent supply of raw material silicon 2 through the supply chute 3. The molten silicon 6 is held in the bottomless crucible 20 which is divided into the electrically conductive mold elements 4 in the circumferential direction. The raw material silicon 2 is melted by electromagnetic force generated by the high-frequency induction coil 5 as it is supplied. The molten silicon 6 is not in contact with the mold elements 4 when it is held by them. The lower part of the molten silicon 6 solidifies due to cooling or radiation. The solidification takes place only in one direction—upward. The solidified part 7 is continuously discharged from the crucible by the guide rolls 8.

The silicon ingot 7 formed in the first step as mentioned above subsequently undergoes the second step. In the second step, the silicon ingot 7 is continuously melted again in the bottomless crucible 20 of the same structure as that used in the first step. The molten silicon 11 is cooled at its lower part. In this way, the silicon ingot 12 (ready to be cut into silicon wafers) is produced continuously. The ingot 12 is cooled at a controlled rate by the annealing heater 13.

The first and second steps may be carried out independently instead of sequentially. If the crucibles in the first and second steps are arranged coaxially one over the other as shown in FIG. 1, it is possible to efficiently transfer the silicon ingot 7 from the first step to the second step without the need to cut it or remove contamination caused by handling. In this case it is necessary that the crucible in the second step have a larger sectional area than that used in the first step. The ratio of the two sectional areas determines the draw rate of the ingots 7 and 12 in the first and second steps.

As mentioned above, the first step involves the blowing of a hot plasma gas incorporated with steam. This plasma gas removes impurities such as B, P, Al, and C from the molten silicon 6 by reactions which change the impurities into gases. The plasma gas, however, does not remove other impurities such as Fe and Ti. These impurities are concentrated in the molten silicon according to the solid-liquid partition ratio as the molten silicon solidifies in one direction at the lower part of the crucible. The plasma gas may be Ar, He, or $H_2$. For effective silicon purification, the plasma gas should be incorporated with at least one of steam, oxidizing gas (such as $O_2$ and $CO_2$), and oxygen-containing substance (such as CaO and $SiO_2$). These additives should be used in an amount of several percent e.g., about 5%. As the first step continues, impurities (such as Fe and Ti) accumulate in the molten silicon 6. At an appropriate time, the molten silicon 6 containing accumulated impurities is solidified and the solid silicon is pulled downward close to the lower end of the crucible 4 and the crucible is replenished with raw material silicon. In this way it is possible to carry out the continuous casting. That zone of the ingot which contains concentrated impurities may be cut off after all the steps are completed.

According to the process of the present invention as mentioned above, it is possible to effectively remove impurities such as B, P, Al, and C from silicon contrary to the general belief that these impurities are difficult to remove, that is, it is possible to purify inexpensive silicon containing a large amount of impurities into high-purity silicon for solar cells.

The second step is intended to produce a silicon ingot which is suitable for solar cell silicon wafers because of its structure and characteristic properties. After solidification, the ingot is kept at a proper temperature by the annealing heater 13 of graphite or conductive ceramics so that the ingot gradually cools at a rate of 100° C./cm or less. This annealing is necessary to reduce residual stresses in the ingot. For the ingot to have a controlled crystal structure, it is necessary that the silicon ingot should be discharged (solidified) more slowly in the second step than in the first step. To this end, the crucible in the second step should have a larger sectional area than that in the first step.

Of course, the second step also removes impurities as the first step does. The removal of impurities depends on their solid-liquid partition ratio. The entire process is usually performed in an inert gas atmosphere. More effective purification may be achieved under reduced pressure.

The silicon ingot 12 obtained as mentioned above may be sliced by a wire saw into wafers of desired thickness. The wafers are used as the polycrystal substrate for solar cells.

The foregoing description is about the basic embodiment of the present invention. The plasma generator used in the first step may be a torch of transfer type or non-transfer type. The plasma may be replaced by a DC arc which produces the same plasma state as required.

The process of the present invention is intended for the production of polycrystal silicon substrates for solar cells. It makes it possible to produce high-purity silicon for solar cell substrates directly from inexpensive raw material silicon containing a comparatively large amount of impurities. It is much simpler than the conventional process and hence it contributes to a great reduction of manpower and production cost.

DESCRIPTION OF THE PREFERRED EMBODIMENTS

Figure 1:
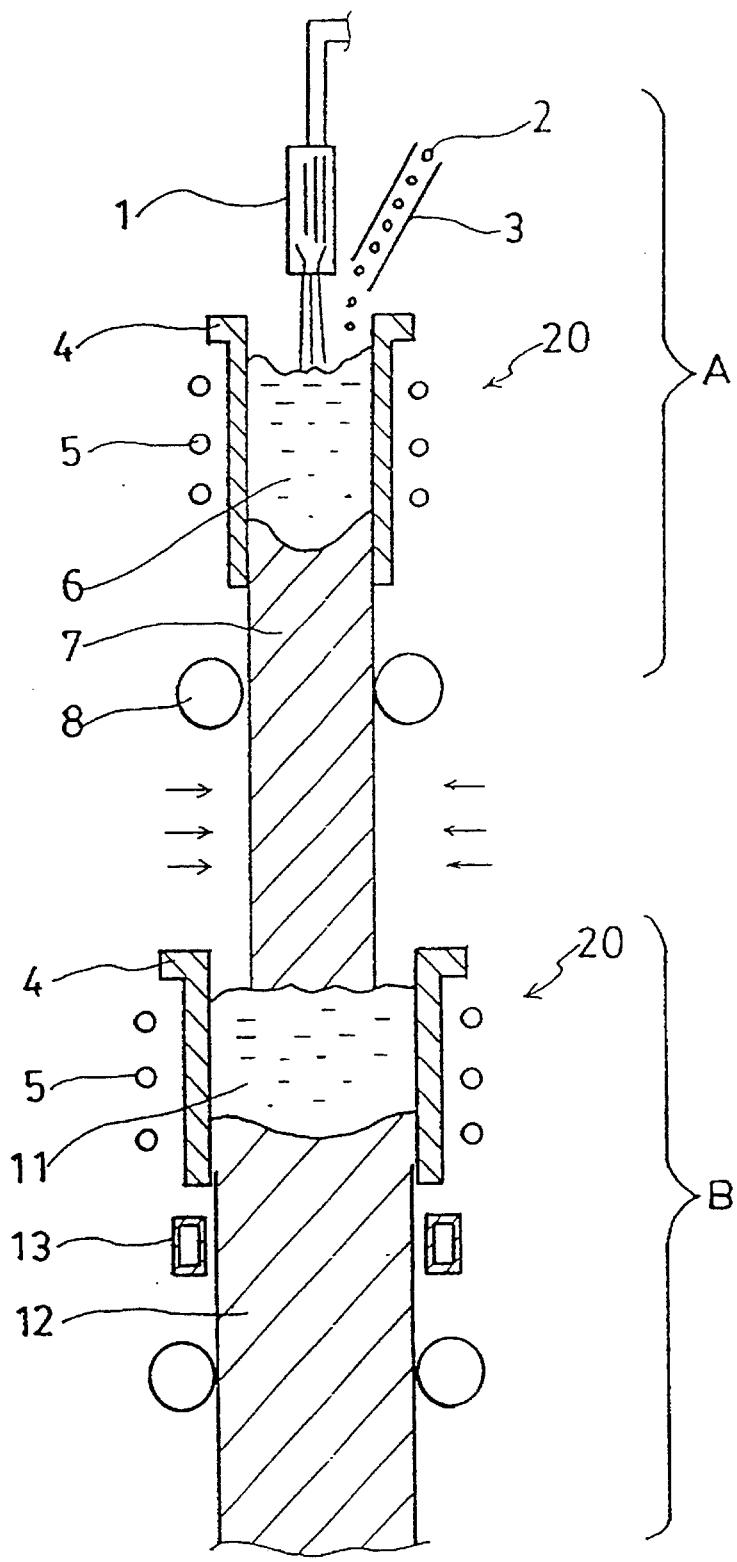
FIG. 1 is a schematic longitudinal sectional view illustrating the process of the present invention.
Figure 2A:
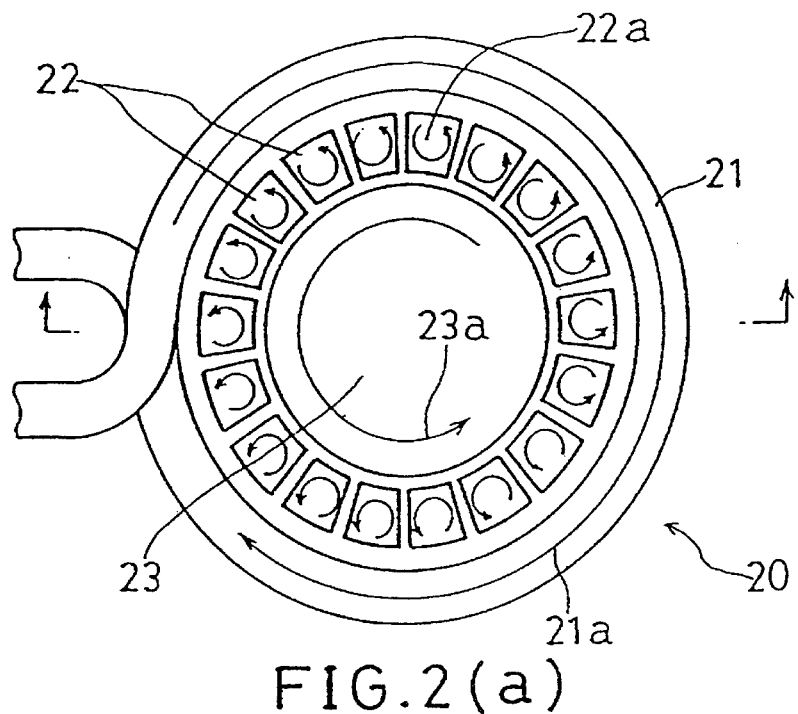
FIGS 2(*a*) and 2(*b*) are schematic representation of the bottomless crucible.
Figure 2B:
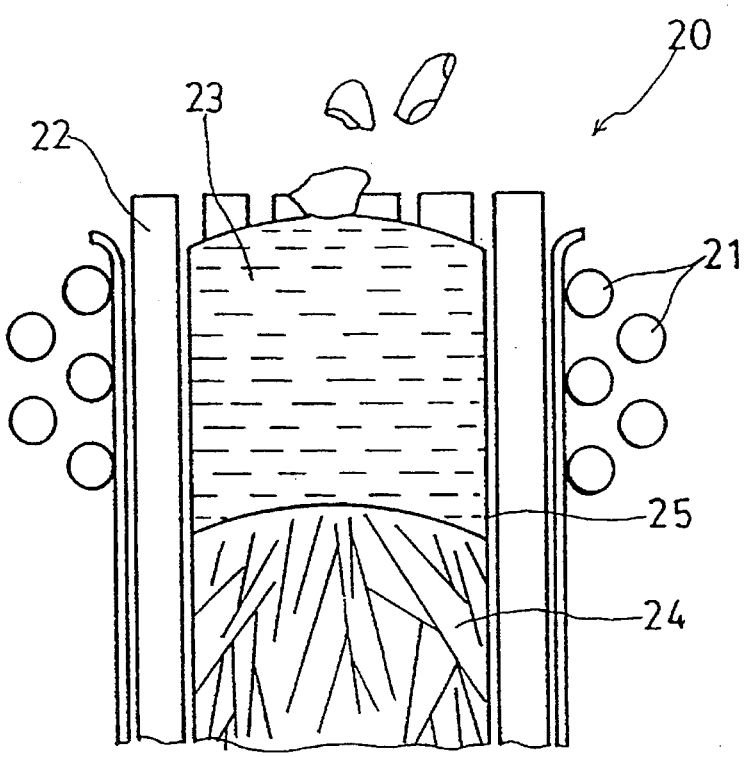

Silicon purification was performed in the following manner using the apparatus as shown in FIG. 1. In the first step, a plasma gas was generated by using a 30 kW non-transfer type plasma torch. The first step employed a crucible having a square section, 85 mm by 85 mm, and the second step employed a crucible having a square section, 120 mm by 120 mm. The former crucible holds 2.5 kg of molten silicon and the latter crucible holds 5.6 kg of molten silicon. In the first step, raw material silicon which contains impurities as shown in Table 1 was supplied intermittently at a rate of about 2 kg/hr, and a hot plasma gas (argon containing 5% steam) generated by the plasma torch was blown on the molten silicon.

The silicon ingot was discharged at a rate of 2 mm/min and 1 mm/min in the first and second steps, respectively. The silicon ingot discharged in the second step was annealed by a graphite heater so that it cooled at a rate of 25°–30° C./cm in the temperature range of 1400° to 1000° C. The thus obtained silicon ingot was found to contain impurities as shown in Table 1. It is noted that the content of each impurity is lower than 1 ppm. The silicon ingot discharged in the second step was sliced by a wire saw into polycrystal substrates (100 mm by 100 mm, 0.5 mm thick). They gave solar cells having a photoelectric conversion efficiency of 13% at AM 1.5.

In the case where the plasma gas was not incorporated with an oxygen-containing substance, it was impossible to reduce the content of B in the raw material silicon.

TABLE 1

| | Analytical Data (ppmW) | | | | | |
|---|---|---|---|---|---|---|
| | B | P | Fe | Al | Ti | C |
| Raw material silicon | 8.0 | 40 | 150 | 100 | 50 | 10 |
| silicon ingot in 1st step | 0.2 | <0.1 | 0.1 | 0.1 | <0.1 | <0.1 |

TABLE 1-continued

| | Analytical Data (ppmW) | | | | | |
|---|---|---|---|---|---|---|
| | B | P | Fe | Al | Ti | C |
| silicon ingot in 2nd step | 0.2 | <0.1 | <0.1 | <0.1 | <0.1 | <0.1 |

What is claimed is:

1. An improved process for producing directly and continuously a high-purity silicon ingot for solar cells, said process comprising:

a first step for a preliminary purification of silicon, said first step comprising continuously melting and holding supplied raw material silicon in a first bottomless crucible placed in an induction coil and continuously discharging a first solidified silicon ingot downward from said bottomless crucible, with at least an axial part of said bottomless crucible being divided into a plurality of electrically conductive pieces spaced circumferentially in said crucible, and then guiding said solidified ingot from said first bottomless crucible to a second bottomless crucible with guide rolls, wherein said first step further includes blowing a plasma gas incorporated with from 2 to about 5 percent water vapor on the surface of the molten silicon for purification, and a second step of melting the first silicon ingot obtained in said first step in said second bottomless crucible, permitting the molten silicon to solidify in one direction, and discharging the solidified silicon continuously, wherein the bottomless crucible in the second step is arranged coaxially with the bottomless crucible in the first step and the ingot in the second step has a larger sectional area than that in the first step.

2. The process of claim 1, wherein the plasma gas is incorporated with water vapor amounting to 5%.

* * * * *

UNITED STATES PATENT AND TRADEMARK OFFICE
CERTIFICATE OF CORRECTION

PATENT NO. : 5,510,095
DATED      : April 23, 1996
INVENTOR(S) : Fukuo Aratani, et al.

It is certified that error appears in the above-indentified patent and that said Letters Patent is hereby corrected as shown below:

On the title page, item [73]:

Add name of second assignee: OSAKA TITANIUM COMPANY LIMITED

Signed and Sealed this

Fifth Day of November, 1996

*Attest:*

BRUCE LEHMAN

*Attesting Officer*    Commissioner of Patents and Trademarks